United States Patent [19]
Yamamoto

[11] Patent Number: 5,646,549
[45] Date of Patent: Jul. 8, 1997

[54] SEMICONDUCTOR DEVICE HAVING AN OUTPUT CIRCUIT FOR TRANSMITTING LOW-VOLTAGE DIFFERENTIAL SIGNALS

[75] Inventor: Keijiro Yamamoto, Kawasaki, Japan

[73] Assignee: Fujitsu Limited, Kawasaki, Japan

[21] Appl. No.: 582,931

[22] Filed: Jan. 4, 1996

[30] Foreign Application Priority Data

Jun. 21, 1995 [JP] Japan ................................ 7-154160

[51] Int. Cl.[6] ............................................. H03K 19/0185
[52] U.S. Cl. ................................ 326/81; 326/31; 327/306
[58] Field of Search ............................ 326/31, 33, 34, 326/83, 112, 81; 327/73, 306

[56] References Cited

U.S. PATENT DOCUMENTS

| | | | |
|---|---|---|---|
| 4,551,642 | 11/1985 | Aizawa et al. | 327/306 |
| 4,595,846 | 6/1986 | Morelli | 326/306 |
| 4,843,340 | 6/1989 | Fenk | 327/306 |
| 4,910,455 | 3/1990 | Nadd | 327/73 |
| 5,122,689 | 6/1992 | Barre | 326/34 |
| 5,218,247 | 6/1993 | Ito | 326/83 |
| 5,345,117 | 9/1994 | Tomotsumo | 327/73 |
| 5,373,199 | 12/1994 | Schichinohe | 326/34 |
| 5,426,377 | 6/1995 | Kimura | 326/34 |
| 5,455,527 | 10/1995 | Murphy | 326/34 |

*Primary Examiner*—Edward P. Westin
*Assistant Examiner*—Benjamin D. Driscoll
*Attorney, Agent, or Firm*—Nikaido, Marmelstein, Murray & Oram LLP

[57] ABSTRACT

A semiconductor device having an output circuit includes a first field-effect transistor having a source connected to a line from which a first voltage is inputted, and a second field-effect transistor having a source connected to a drain of the first field-effect transistor, a gate connected to a data line from which a level signal is inputted, and a drain connected to an output terminal to which an output signal is outputted. A control unit controls a voltage at a gate of the first field-effect transistor when the second field-effect transistor is in ON state, so that a voltage at the drain of the second field-effect transistor is equal to a second voltage.

12 Claims, 4 Drawing Sheets

SEMICONDUCTOR DEVICE HAVING AN OUTPUT CIRCUIT FOR TRANSMITTING LOW-VOLTAGE DIFFERENTIAL SIGNALS

BACKGROUND OF THE INVENTION (1) Field of the Invention

The present invention relates to a semiconductor device which includes an output circuit for transmitting output signals on transmission lines such as wires on a printed circuit board.

(2) Description of the Related Art

A signal transmission system includes a CMOS (complementary metal oxide semiconductor) device which is an output circuit for transmitting output signals on transmission lines. The CMOS device uses a p-channel metal-oxide-semiconductor field-effect transistor (which will be called the p-channel MOS FET) to perform a pull-up action, and uses an n-channel metal-oxide-semiconductor field-effect transistor (which will be called the n-channel MOS FET) to perform a pull-down action. In this system, the capacity of wires which are connected to external terminals of the system to which outputs of the output circuit are connected is taken as a load capacity.

In the above signal transmission system, signals are transmitted on the transmission lines by charging and discharging the wires having a certain capacity. For periods in which noise signals are produced due to signal reflection, the timing of the charging and discharging of the wires is allocated. The amplitude of the signal transmitted by the above signal transmission system is so great that high-speed transmission may be hardly provided. Also, the above signal transmission system requires a great amount of power consumption.

In order to realize a high-speed transmission and a small amount of power consumption, it is necessary that the above signal transmission system is provided with an output circuit having a characteristic impedance which is equivalent to a characteristic impedance of the wires. The wires are taken as the signal transmission lines having a characteristic impedance which is constant.

Low-voltage-differential-signal (LVDS) transmission systems have been proposed to allow high-speed signal transmission and small power consumption. The LVDS transmission systems serves to provide long-distance, high-frequency signal transmission capabilities. A standardization of the LVDS transmission systems by the Institute of Electrical and Electronic Engineers (IEEE) is under way.

FIG.5 shows a LVDS transmission system which is given as an example of the above-mentioned LVDS systems.

Referring to FIG.5, the LVDS transmission system comprises an integrated circuit 1 and an integrated circuit 2. An output circuit 3 is provided in the integrated circuit 1. The integrated circuit 1 has external terminals 4 and 5. An input circuit 10 including a differential amplifier is provided in the integrated circuit 2. The integrated circuit 2 has external terminals 8 and 9.

The external terminals 4 and 5 of the integrated circuit 1 and the external terminals 8 and 9 of the integrated circuit 2 are interconnected by wires 6 and 7, respectively. The wires 6 and 7 serve as transmission lines on which differential signals are transmitted.

A terminating resistor 11 between differential input terminals of the input circuit 10 is connected. The terminating resistor 11 has a resistance of 100Ω.

In the LVDS transmission system, shown in FIG.5, the output circuit 3 outputs differential signals, which have a complementary relation, to the wires 6 and 7, and the wires 6 and 7 are connected by the terminating resistor 11 at the differential input terminals of the input circuit 10 in the integrated circuit 2. Thus, the differential signals with a small amplitude are transmitted from the output circuit 3 to the input circuit 10 through the transmission lines 6 and 7.

FIG.6 shows a conceived output circuit which is included in the LVDS transmission system in FIG.5.

Referring to FIG.6, this output circuit has a line from which a level signal DATA from an internal circuit (not shown) is inputted. The output circuit includes an inverter 13 which generates an inverted data signal at an output of the inverter 13 from the data signal DATA at an input of the inverter 13. The output circuit includes an output inverter 14, an output inverter 15, a p-channel metal-oxide-semiconductor field-effect transistor (which will be called the p-channel MOS FET) 16, a p-channel MOS FET 17, an n-channel metal-oxide-semiconductor field-effect transistor (which will be called the n-channel MOS FET) 18, and an n-channel MOS FET 19. A source power voltage VDD is applied to each of the p-channel MOS FETs 16 and 17, and a grounding voltage VSS is applied to each of the n-channel MOS FETs 18 and 19.

In the output circuit, shown in FIG. 6, a resistor 20 with a precise resistance is connected to an output of the output inverter 14, and a resistor 21 with a precise resistance is connected to an output of the output inverter 15. An error of the resistances of the resistors 20 and 21 is not greater than 10%, and the resistors 20 and 21 have such resistances that "ON" resistances of the inverters 14 and 15 can be taken as the resistances of the resistors 20 and 21.

Generally, the "ON" resistances of the p-channel MOS FETs 16 and 17 and the n-channel MOS FETs 18 and 19 have errors which are above 30%, due to manufacturing errors. In the above-mentioned LVDS transmission system, it is required that an error of a reference voltage VOL for a low-level output and an error of a reference voltage VOH for a high-level output are not greater than 10%.

In the output circuit, shown in FIG. 6, the resistors 20 and 21 are provided so as to cancel the errors of the "ON" resistances of the inverters 14 and 15. It is necessary that the errors of the "ON" resistances of the inverters 14 and 15 be less than 10%, to ensure the accuracy of the reference voltage VOL for the low-level output and the reference voltage VOH for the high-level output.

However, a conventional CMOS producing process does not include a step of forming resistors with precise resistances the errors of which are less than 10%. When producing a semiconductor device including the output circuit shown in FIG. 6, it is necessary to add the step of forming the resistors to the conventional CMOS producing process in order to form the resistors 20 and 21 in the output circuit. Therefore, there is a problem in that the cost of the produced semiconductor device is increased because of the added step.

SUMMARY OF THE INVENTION

An object of the present invention is to provide an improved semiconductor device in which the above-described problems are eliminated.

Another object of the present invention is to provide a semiconductor device in which an output circuit transmits differential signals with accurate high-level and/or low-level values on transmission lines at a high speed.

Still another object of the present invention is to provide a semiconductor device including an output circuit which is useful and inexpensive, and manufacturing the semiconductor device does not require an additional step, such as a step of forming resistors with precise resistances, which causes the cost to be increased.

The above-mentioned objects of the present invention are achieved by a semiconductor device having an output circuit which includes a first field-effect transistor having a source connected to a line from which a first voltage is inputted; a second field-effect transistor having a source connected to a drain of the first field-effect transistor, a gate connected to a data line from which a level signal is inputted, and a drain connected to an output terminal to which an output signal is outputted; and a control unit which controls a voltage at a gate of the first field-effect transistor when the second field-effect transistor is in ON state, so that a voltage at the drain of the second field-effect transistor is held at a second voltage.

The above-mentioned objects of the present invention are achieved by a semiconductor device having an output circuit which includes a first p-channel field-effect transistor having a source connected to a first line from which a first voltage is inputted; a second p-channel field-effect transistor having a source connected to a drain of the first p-channel field-effect transistor, the second p-channel field-effect transistor being in ON state when the output circuit is operated; a first control unit which controls a voltage at a gate of the first p-channel field-effect transistor when the second p-channel field-effect transistor is in ON state, so that a voltage at a drain of the second p-channel field-effect transistor is held at a second voltage lower than the first voltage; a first n-channel field-effect transistor having a source connected to a second line from which a third voltage lower than the second voltage is inputted; a second n-channel field-effect transistor having a source connected to a drain of the first n-channel field-effect transistor, the second n-channel field-effect transistor being in ON state when the output circuit is operated; a second control unit which controls a voltage at a gate of the first n-channel field-effect transistor when the second n-channel field-effect transistor is in ON state, so that a voltage at a drain of the second n-channel field-effect transistor is held at a fourth voltage higher than the third voltage, the fourth voltage being lower than the second voltage; and a signal generator unit which generates output signals, voltages of the output signals being controlled by the first control unit and the second control unit, so that high-level values of the output signals are equal to the voltage at the drain of the second p-channel field-effect transistor and low-level values of the output signals are equal to the voltage at the drain of the second n-channel field-effect transistor.

According to the present invention, it is possible that the output circuit transmit the output signal with an accurate high-level or low-level value. An amplitude of the output signal can be made smaller than an amplitude of the level signal indicative of CMOS level data. Therefore, the output circuit of the semiconductor device of the present invention can provide high-speed signal transmission with the output signal having an accurate value.

According to the present invention, the output circuit does not require resistors with precise resistances included, which causes the cost to be increased. Therefore, it is possible to provide the semiconductor device including the output circuit with a low cost.

According to the present invention, it is possible that the output circuit transmit the output signals with accurate high-level and low-level values. The amplitude of the output signals can be made smaller than the amplitude of the level signals indicative of the CMOS level data. Therefore, the output circuit of the semiconductor device of the present invention can provide high-speed signal transmission with the output signals having accurate values.

BRIEF DESCRIPTION OF THE DRAWINGS

The above and other objects, features and advantages of the present invention will become more apparent from the following detailed description when read in conjunction with the accompanying drawings in which.

DESCRIPTION OF THE PREFERRED EMBODIMENTS

A description will now be given of the preferred embodiments of the present invention with reference to the accompanying drawings.

Figure 1:
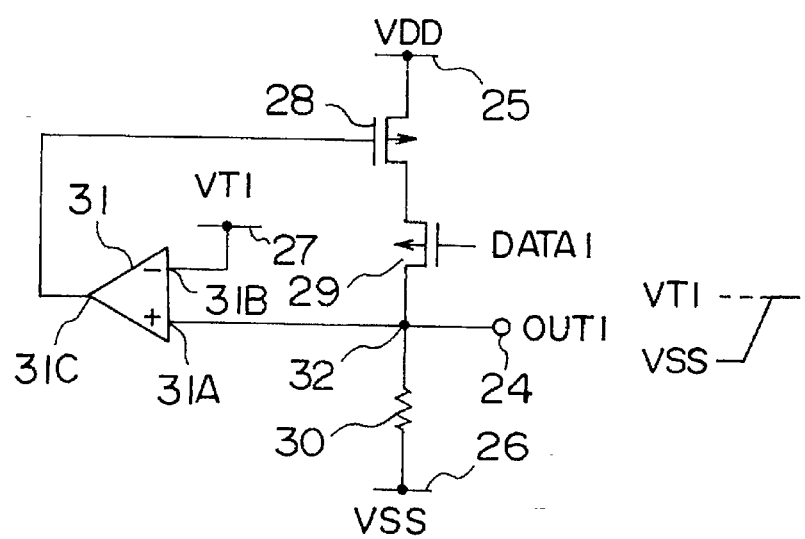
FIG. 1 is a circuit diagram of an output circuit of a semiconductor device in one embodiment of the present invention.

FIG. 1 shows an output circuit of a semiconductor device in one embodiment of the present invention. The output circuit in FIG. 1 is included in the semiconductor device in this embodiment.

Referring to FIG. 1, the output circuit has a data line from which a level signal DATA1 from an internal circuit (not shown) is inputted. The level signal DATA1 is indicative of CMOS level data. The output circuit includes an output terminal 24 to which an output signal OUT1 is outputted by the output circuit.

A source-power voltage VDD from a VDD power line 25 is inputted to the output circuit. A grounding voltage VSS from a VSS ground line 26 is inputted to the output circuit. A source-power voltage VT1 from a VT1 power line 27 is inputted to the output circuit. The source-power voltage VT1 is lower than the source-power voltage VDD and higher than the grounding voltage VSS. The source-power voltage VT1 is an intermediate voltage between the grounding voltage VSS and the source-power voltage VDD (VSS<VT1<VDD).

The output circuit in FIG. 1 includes a p-channel MOS FET 28, a p-channel MOS FET 29, a resistor 30, and a differential amplifier 31. This differential amplifier 31 has a noninverting input 31A, an inverting input 31B, and an output 31C.

The p-channel MOS FET 28 has a source connected to the VDD power line 25, a drain, and a gate connected to the output 31C of the differential amplifier 31.

The p-channel MOS FET 29 has a source connected to the drain of the p-channel MOS FET 28, a drain connected to the output terminal 24, and a gate connected to the data line from which the level signal DATA1 is inputted.

The resistor 30 has an end connected to the output terminal 24, and the other end of the resistor 30 is connected to the VSS ground line 26.

The differential amplifier 31 has the noninverting input 31A connected to the drain of the p-channel MOS FET 29, and the inverting input 31B connected to the VT1 source-power line 27.

In the above embodiment, when the level signal DATA1 indicative of a high-level value is inputted, the p-channel MOS FET 29 is in OFF state (or in a nonconductive condition). At this time, a voltage at a node 32 of the output circuit is equal to the grounding voltage VSS, and a voltage of the output signal OUT1 is equal to the grounding voltage VSS.

When the level signal DATA1 indicative of a low-level value is inputted, the p-channel MOS FET 29 is in ON state (or in a conductive condition). If the voltage at the node 32 at this time is higher than the source-power voltage VT1, a voltage at the output 31C of the differential amplifier 31 is high. An "ON" resistance of the p-channel MOS FET 28 is increased, and the voltage at the node 32 is lowered to the source-power voltage VT1. If the voltage at the node 32 at this time is lower than the source-power voltage VT1, the voltage at the output 31C of the differential amplifier 31 is low. The "ON" resistance of the p-channel MOS FET 28 is decreased, and the voltage at the node 32 is increased to the source-power voltage VT1.

Accordingly, when the level signal DATA1 indicative of the low-level value is inputted, the voltage at the node 32 is equal to the source-power voltage VT1 regardless of the manufacturing errors, and the voltage of the output signal OUT1 is equal to the source-power voltage VT1.

In the above embodiment, it is possible that the output circuit transmit the output signal OUT1 with an accurate high-level value (VT1). An amplitude of the output signal OUT1 can be made smaller than an amplitude of the level signal DATA1 indicative of the CMOS level data. Therefore, the output circuit of the semiconductor device in the above embodiment can provide high-speed signal transmission.

In the above embodiment, the output circuit does not require resistors with precise resistances included therein, which causes the cost to be increased. Therefore, it is possible to provide the semiconductor device including the output circuit with a low cost.

A modification of the output circuit in this embodiment may be made, so that it includes an input terminal from which the source-power voltage VT1 is inputted. In this modification, it is possible to input the source-power voltage VT1 the value of which is variable according to the operating conditions of the output circuit. This is useful when a desired value of the source-power voltage VT1 is inputted.

Figure 2:
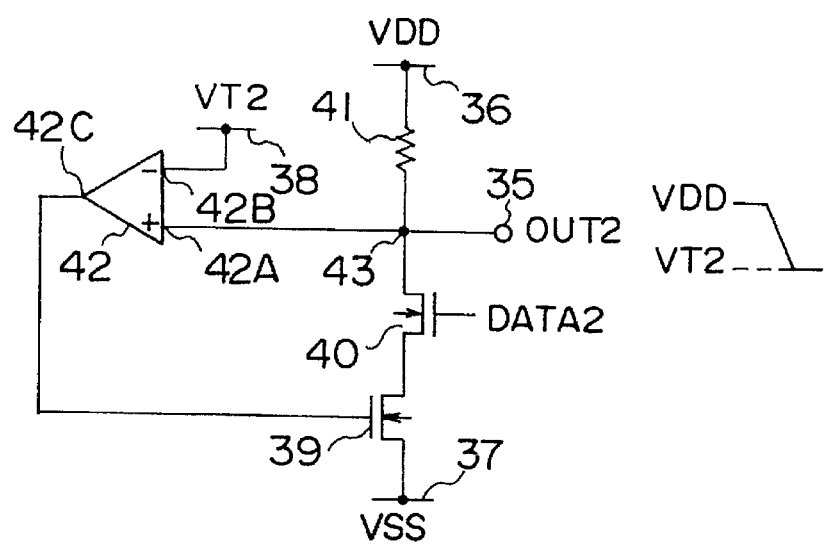
FIG. 2 is a circuit diagram of an output circuit of a semiconductor device in another embodiment of the present invention.

FIG. 2 shows an output circuit of a semiconductor device in another embodiment of the present invention. The output circuit in FIG. 2 is included in the semiconductor device in this embodiment.

Referring to FIG. 2, the output circuit has a data line from which a level signal DATA2 from an internal circuit (not shown) is inputted. The level signal DATA2 is indicative of CMOS level data. The output circuit includes an output terminal 35 to which an output signal OUT2 is outputted by the output circuit.

A source-power voltage VDD from a VDD power line 36 is inputted to the output circuit. A grounding voltage VSS from a VSS ground line 37 is inputted to the output circuit. A source-power voltage VT2 from a VT2 power line 38 is inputted to the output circuit. The source-power voltage VT2 is lower than the source-power voltage VDD and higher than the grounding voltage VSS. The source-power voltage VT2 is an intermediate voltage between the grounding voltage VSS and the source-power voltage VDD (VSS<VT2<VDD).

The output circuit in FIG. 2 includes an n-channel MOS FET 39, an n-channel MOS FET 40, a resistor 41, and a differential amplifier 42. This differential amplifier 42 has a noninverting input 42A, an inverting input 42B, and an output 42C.

The n-channel MOS FET 39 has a source connected to the VDD power line 37, a drain, and a gate connected to the output 42C of the differential amplifier 42.

The n-channel MOS FET 40 has a source connected to the drain of the n-channel MOS FET 39, a drain connected to the output terminal 35, and a gate connected to the data line from which the level signal DATA2 is inputted.

The resistor 41 has an end connected to the output terminal 35, and the other end of the resistor 41 is connected to the VDD power line 36.

The differential amplifier 42 has the noninverting input 42A connected to the drain of the n-channel MOS FET 40, and the inverting input 42B connected to the VT2 source-power line 38.

In the above embodiment, when the level signal DATA2 indicative of a low-level value is inputted, the n-channel MOS FET 40 is in OFF state (or in a nonconductive condition). At this time, a voltage at a node 43 of the output circuit is equal to the source-power voltage VDD, and a voltage of the output signal OUT2 is equal to the source-power voltage VDD.

When the level signal DATA2 indicative of a high-level value is inputted, the n-channel MOS FET 40 is in ON state (or in a conductive condition). If the voltage at the node 43 at this time is higher than the source-power voltage VT2, a voltage at the output 42C of the differential amplifier 42 is high. An "ON" resistance of the n-channel MOS FET 39 is decreased, and the voltage at the node 43 is lowered to the source-power voltage VT2. If the voltage at the node 43 at this time is lower than the source-power voltage VT2, the voltage at the output 42C of the differential amplifier 42 is low. The "ON" resistance of the n-channel MOS FET 39 is increased, and the voltage at the node 43 is increased to the source-power voltage VT2.

Accordingly, when the level signal DATA2 indicative of the high-level value is inputted, the voltage at the node 43 is equal to the source-power voltage VT2 regardless of the manufacturing errors, and the voltage of the output signal OUT2 is equal to the source-power voltage VT2.

In the above embodiment, it is possible that the output circuit transmit the output signal OUT2 with an accurate low-level value (VT2). An amplitude of the output signal OUT2 can be made smaller than an amplitude of the level signal DATA2 indicative of the CMOS level data. Therefore, the output circuit of the semiconductor device in the above embodiment can provide high-speed signal transmission.

In the above embodiment, the output circuit does not require resistors with precise resistances included therein, which causes the cost to be increased. Therefore, it is possible to provide the semiconductor device including the output circuit with a low cost.

A modification of the output circuit in this embodiment may be made, so that it includes an input terminal from which the source-power voltage VT2 is inputted. In this modification, it is possible to input the source-power voltage VT2 the value of which is variable according to the operating conditions of the output circuit. This is useful when a desired value of the source-power voltage VT2 is inputted.

Figure 3:
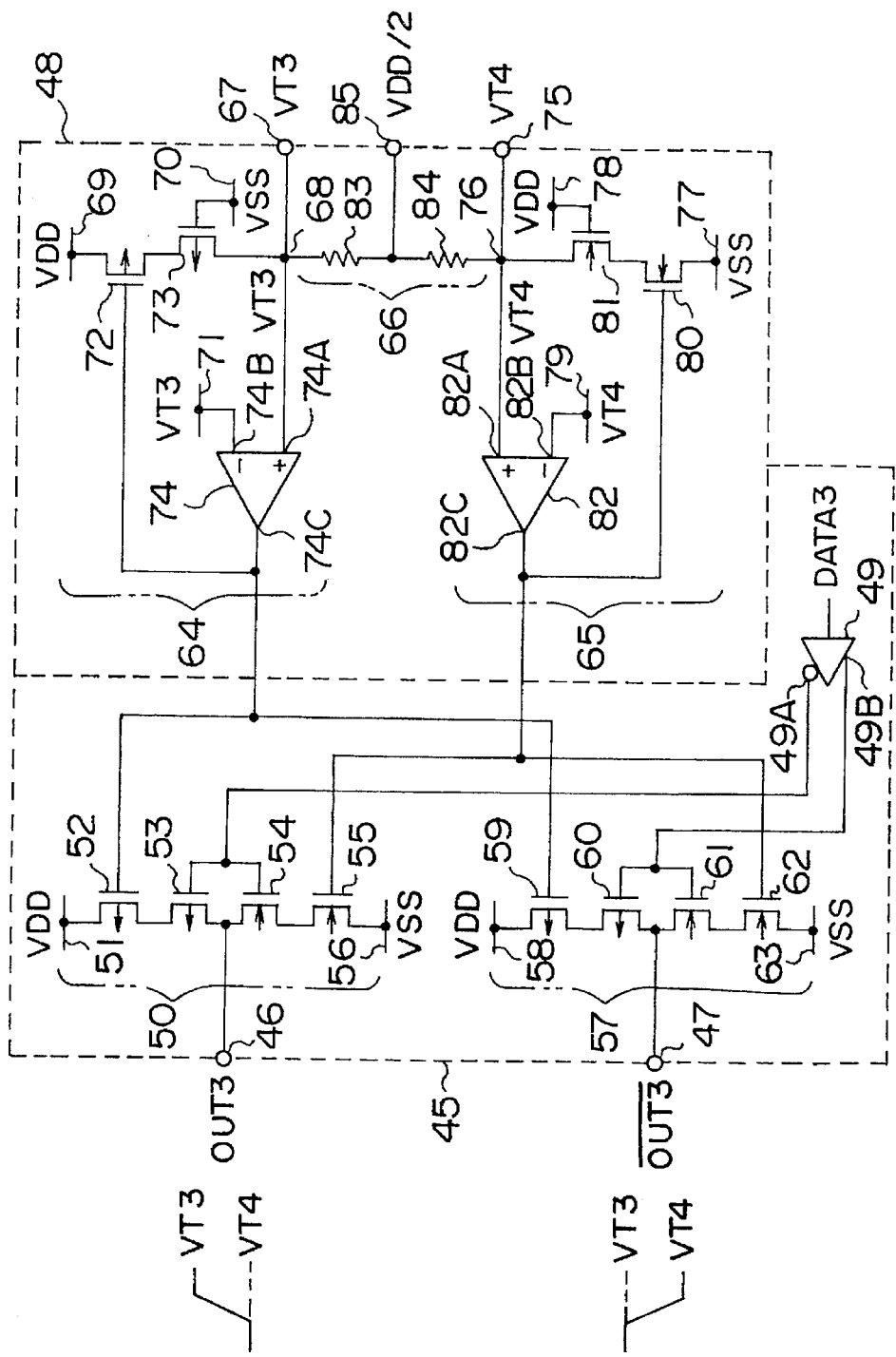
FIG. 3 is a circuit diagram of an output circuit of a semiconductor device in still another embodiment of the present invention.

FIG. 3 shows an output circuit of a semiconductor device in still another embodiment of the present invention. The output circuit in FIG. 3 is included in the semiconductor device in this embodiment.

Referring to FIG. 3, this output circuit includes a signal generator unit 45 which generates an output signal OUT3 and an inverted output signal /OUT3. The output signals OUT3 and /OUT3 have a complementary relation. The output circuit includes an output terminal 46 to which the output signal OUT3 from the signal generator unit 45 is outputted, and an output terminal 47 to which the output signal /OUT3 from the signal generator unit 45 is outputted.

The output circuit in FIG. 3 includes an output level setting unit 48 which determines high-level and low-level values of the output signal OUT3 and determines high-level and low-level values of the output signal /OUT3.

The signal generator unit 45 includes an inverting unit 49 having an input from which a level signal DATA3 from an internal circuit (not shown) is inputted. The level signal DATA3 is indicative of CMOS level data. This inverting unit 49 has an inverting output 49A and a noninverting output 49B.

The signal generator unit 45 includes an inverter 50 which outputs the output signal OUT3 to the output terminal 46. An inverting action of the inverter 50 is controlled by a signal output from the inverting output 49A of the inverting unit 49.

The inverter 50 includes a VDD power line 51, a p-channel MOS FET 52, and a p-channel MOS FET 53. The p-channel MOS FET 52 has a gate whose voltage is controlled by the output level setting unit 48. The ON/OFF state of the p-channel MOS FET 53 is controlled by the signal output from the inverting output 49A of the inverting unit 49.

The inverter 50 further includes an n-channel MOS FET 54, an n-channel MOS FET 55, and a VSS ground line 56. The ON/OFF state of the n-channel MOS FET 54 is controlled by the signal output from the inverting output 49A of the inverting unit 49. The n-channel MOS FET 55 has a gate whose voltage is controlled by the output level setting unit 48.

The signal generator unit 45 further includes an inverter 57 which outputs the output signal /OUT3 to the output terminal 47. An inverting action of the inverter 57 is controlled by a signal output from the noninverting output 49B of the inverter 49.

The inverter 57 includes a VDD power line 58, a p-channel MOS FET 59, and a p-channel MOS FET 60. The p-channel MOS FET 59 has a gate whose voltage is controlled by the output level setting unit 48. The ON/OFF state of the p-channel MOS FET 60 is controlled by the signal output from the noninverting output 49B of the inverting unit 49.

The inverter 57 further includes an n-channel MOS FET 61, an n-channel MOS FET 62, and a VSS ground line 63. The ON/OFF state of the n-channel MOS FET 61 is controlled by the signal output from the noninverting output 49B of the inverting unit 49. The n-channel MOS FET 62 has a gate whose voltage is controlled by the output level setting unit 48.

The output level setting unit 48 includes a high-level value setting unit 64 which determines a high-level value of the output signal OUT3 and a high-level value of the output signal /OUT3. The output level setting unit 48 includes a low-level value setting unit 65 which determines a low-level value of the output signal OUT3 and a low-level value of the output signal /OUT3. The output level setting unit 48 further includes a resistor unit 66 which ensures stable actions of the high-level value setting unit 64 and the low-level value setting unit 65.

The high-level value setting unit 64 includes an output terminal 67 to which a source-power voltage VT3 at a node 68 is outputted, a VDD power line 69, a VSS ground line 70, and a VT3 power line 71. The source-power voltage VT3 from the VT3 power line 71 is inputted, and the source-power voltage VT3 is lower than the source-power voltage VDD and higher than an intermediate voltage of VDD/2 (VDD/2<VT3<VDD).

The high-level value setting unit 64 further includes a p-channel MOS FET 72, a p-channel MOS FET 73, and a differential amplifier 74. This differential amplifier 74 has a noninverting input 74A, an inverting input 74B, and an output 74C.

The p-channel MOS FET 72 has a source connected to the VDD power line 69, a drain, and a gate connected to the output 74C of the differential amplifier 74.

The p-channel MOS FET 73 has a source connected to the drain of the p-channel MOS FET 72, a drain connected to the output terminal 67, and a gate connected to the VSS ground line 70.

The differential amplifier 74 has the noninverting input 74A connected to the drain of the p-channel MOS FET 73, the inverting input 74B connected to the VT3 power line 71, and the output 74C connected to each of the gate of the p-channel MOS FET 52 in the inverter 50 and the gate of the p-channel MOS FET 59 in the inverter 57.

The low-level value setting unit 65 includes an output terminal 75 to which a source-power voltage VT4 at a node 76 is outputted, a VSS ground line 77, a VDD power line 78, and a VT4 power line 79. The source-power voltage VT4 from the VT4 power line 79 is inputted, and the source-power voltage VT4 is higher than the source-power voltage VSS and lower than the intermediate voltage of VDD/2 (VSS<VT4<VDD/2).

The low-level value setting unit 65 further includes an n-channel MOS FET 80, an n-channel MOS FET 81, and a differential amplifier 82. This differential amplifier 82 has a noninverting input 82A, an inverting input 82B, and an output 82C.

The n-channel MOS FET 80 has a source connected to the VSS ground line 77, a drain, and a gate connected to the output 82C of the differential amplifier 82.

The n-channel MOS FET 81 has a source connected to the drain of the n-channel MOS FET 80, a drain connected to the output terminal 75, and a gate connected to the VDD power line 78.

The differential amplifier 82 has the noninverting input 82A connected to the drain of the n-channel MOS FET 81, the inverting input 82B connected to the VT4 power line 79, and the output 82C connected to each of the gate of the n-channel MOS FET 55 in the inverter 50 and the gate of the n-channel MOS FET 62 in the inverter 57.

The resistor unit 66 includes a resistor 83, a resistor 84, and an input terminal 85 from which the intermediate voltage of VDD/2 is inputted. The input terminal 85 is connected to a connection point between the resistor 83 and the resistor 84. The resistor 83 has one end connected to the drain of the p-channel MOS FET 73, and the other end of the resistor 83 is connected to the input terminal 85. The resistor 84 has one end connected to the drain of the n-channel MOS FET 81, and the other end of the resistor 84 is connected to the input terminal 85.

In the high-level value setting unit 64, the gate of the p-channel MOS FET 73 is connected to the VSS ground line 70. Thus, when the output circuit is operated, the p-channel MOS FET 73 is in ON state.

If the voltage at the node 68 at this time is higher than the source-power voltage VT3, the voltage at the output 74C of the differential amplifier 74 is high. The "ON" resistance of the p-channel MOS FET 72 is increased. Thus, the voltage at the node 68 is lowered to the source-power voltage VT3.

If the voltage at the node 68 at this time is lower than the source-power voltage VT3, the voltage at the output 74C of the differential amplifier 74 is low. The "ON" resistance of the p-channel MOS FET 72 is decreased. Thus, the voltage at the node 68 is increased to the source-power voltage VT3.

Accordingly, in the high-level value setting unit 64, the voltage at the node 68 is controlled by the differential amplifier 74. The high-level value setting unit 64 therefore holds the source-power voltage VT3 at an accurate high-level value regardless of the manufacturing errors.

In the low-level value setting unit 65, the gate of the n-channel MOS FET 81 is connected to the VDD power line 78. Thus, when the output circuit is operated, the n-channel MOS FET 81 is in ON state.

If the voltage at the node 76 at this time is higher than the source-power voltage VT4, the voltage at the output 82C of the differential amplifier 82 is high. The "ON" resistance of the n-channel MOS FET 80 is decreased. Thus, the voltage at the node 76 is lowered to the source-power voltage VT4.

If the voltage at the node 76 at this time is lower than the source-power voltage VT4, the voltage at the output 82C of the differential amplifier 82 is low. The "ON" resistance of the n-channel MOS FET 80 is increased. Thus, the voltage at the node 76 is increased to the source-power voltage-VT4.

Accordingly, in the low-level value setting unit 65, the voltage at the node 76 is controlled by the differential amplifier 82. The low-level value setting unit 65 therefore holds the source-power voltage VT4 at an accurate low-level value regardless of the manufacturing errors.

In the above embodiment, when the level signal DATA3 indicative of the high-level value is inputted during the operation, the inverting output 49A of the inverter unit 49 is low, and the noninverting output 49B of the inverter unit 49 is high.

At this time, in the inverter 50, the p-channel MOS FET 53 is in ON state and the n-channel MOS FET 54 is in OFF state. Also, in the inverter 57, the p-channel MOS FET 60 is in OFF state and the n-channel MOS FET 61 is in ON state.

In the inverter 50, the p-channel MOS FETs 52 and 53 perform a pull-up action during the operation. A structure of the p-channel MOS FETs 52 and 53 in the inverter 50 is the same as the above-described structure of the p-channel MOS FETs 72 and 73 in the high-level value setting unit 64, and a description thereof will be omitted.

The source-power voltage VDD from the VDD power line 51 is inputted to the source of the p-channel MOMOS FET 52, and the voltage at the output 74C of the differential amplifier 74 is inputted to the gate of the p-channel MOS FET 52. The "ON" resistance of the p-channel MOS FET 52 is controlled so that it is equal to the "ON" resistance of the p-channel MOS FET 72.

Accordingly, the voltage at the output terminal 46 of the inverter 50 is held at the source-power voltage VT3 regardless of the manufacturing errors, similarly to the voltage at the node 68. The voltage of the output signal OUT3 is equal to the source-power voltage VT3. As described above, the source-power voltage VT3 is held at an accurate high-level value by the high-level value setting unit 64.

In the inverter 57, the n-channel MOS FETs 61 and 62 perform a pull-down action during the operation. A structure of the n-channel MOS FETs 61 and 62 in the inverter 57 is the same as the above-described structure of the n-channel MOS FETs 81 and 82 in the low-level value setting unit 65, and a description thereof will be omitted.

The grounding voltage VSS from the VSS ground line 63 is inputted to the source of the n-channel MOS FET 62, and the voltage at the output 82C of the differential amplifier 82 is inputted to the gate of the n-channel MOS FET 62. Thus, the "ON" resistance of the n-channel MOS FET 62 is controlled so that it is equal to the "ON" resistance of the n-channel MOS FET 80.

Accordingly, the voltage at the output terminal 47 of the inverter 57 is held at the source-power voltage VT4 regardless of the manufacturing errors, similarly to the voltage at the node 76. The voltage of the output signal/OUT3 is equal to the source-power voltage VT4. As described above, the source-power voltage VT4 is held at an accurate low-level value by the low-level value setting unit 65.

On the other hand, in the above embodiment, when the level signal DATA3 indicative of the low-level value is inputted during the operation, the inverting output 49A of the inverter unit 49 is high, and the noninverting output 49B of the inverter unit 49 is low.

At this time, in the inverter 50, the p-channel MOS FET 53 is in OFF state and the n-channel MOS FET 54 is in ON state. Also, in the inverter 57, the p-channel MOS FET 60 is in ON state and the n-channel MOS FET 61 is in OFF state.

In the inverter 50, the n-channel MOS FETs 54 and 55 perform a pull-up action during the operation. A structure of the n-channel MOS FETs 54 and 55 in the inverter 50 is the same as the above-described structure of the n-channel MOS FETs 81 and 80 in the low-level value setting unit 65, and a description thereof will be omitted.

The grounding voltage VSS from the VSS ground line 56 is inputted to the source of the n-channel MOS FET 55, and the voltage at the output 82C of the differential amplifier 82 is inputted to the gate of the n-channel MOS FET 55. The "ON" resistance of the n-channel MOS FET 55 is controlled so that it is equal to the "ON" resistance of the n-channel MOS FET 80.

Accordingly, the voltage at the output terminal 46 of the inverter 50 is held at the source-power voltage VT4 regardless of the manufacturing errors, similarly to the voltage at the node 76. The voltage of the output signal OUT3 is equal to the source-power voltage VT4.

In the inverter 57, the p-channel MOS FETs 59 and 60 perform a pull-up action during the operation. A structure of the p-channel MOS FETs 59 and 60 in the inverter 57 is the same as the above-described structure of the p-channel MOS FETs 72 and 73 in the high-level value setting unit 64, and a description thereof will be omitted.

The source-power voltage VDD from the VDD power line 58 is inputted to the source of the p-channel MOS FET 59, and the voltage at the output 74C of the differential amplifier 74 is inputted to the gate of the p-channel MOS FET 59. Thus, the "ON" resistance of the n-channel MOS FET 59 is controlled so that it is equal to the "ON" resistance of the p-channel MOS FET 72.

Accordingly, the voltage at the output terminal 47 of the inverter 57 is held at the source-power voltage VT3 regardless of the manufacturing errors, similarly to the voltage at the node 68. The voltage of the output signal /OUT3 is equal to the source-power voltage VT3.

In the above embodiment, it is possible that the output circuit of the semiconductor device transmit the output signals OUT3 and/OUT3 with accurate high-level and low-level values (VT3 and VT4). The amplitude of the output signals OUT3 and/OUT3 can be made smaller than the amplitude of the level signal DATA3 indicative of the CMOS level data. Therefore, the output circuit of the semiconductor device in the above embodiment can provide high-speed signal transmission.

In the above embodiment, the output circuit does not require resistors with precise resistances included therein, which causes the cost to be increased. Therefore, it is possible to provide the semiconductor device including the output circuit with a low cost.

The above embodiment is appropriate for applications to an output circuit of a LVDS transmission system. A modification of the output circuit in this embodiment may be made, so that it includes input terminals from which the source-power voltages VT3 and VT4 are inputted. In this modification, it is possible to input the source-power voltages VT3 and VT4 the levels of which are variable according to the operating conditions of the output circuit. This is useful when desired high-level and low-level values of the source-power voltages VT3 and VT4 are inputted.

Figure 4:
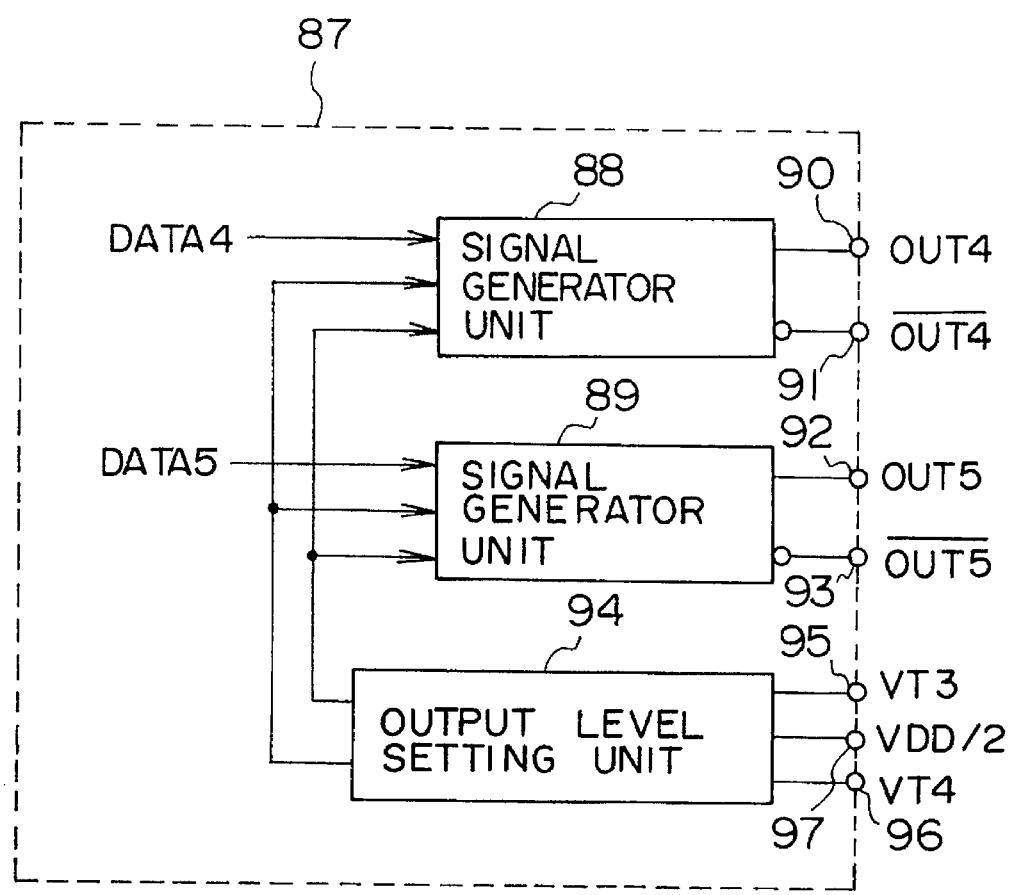
FIG. 4 is a circuit diagram of an output circuit of a semiconductor device in a further embodiment of the present invention.
Figure 5:
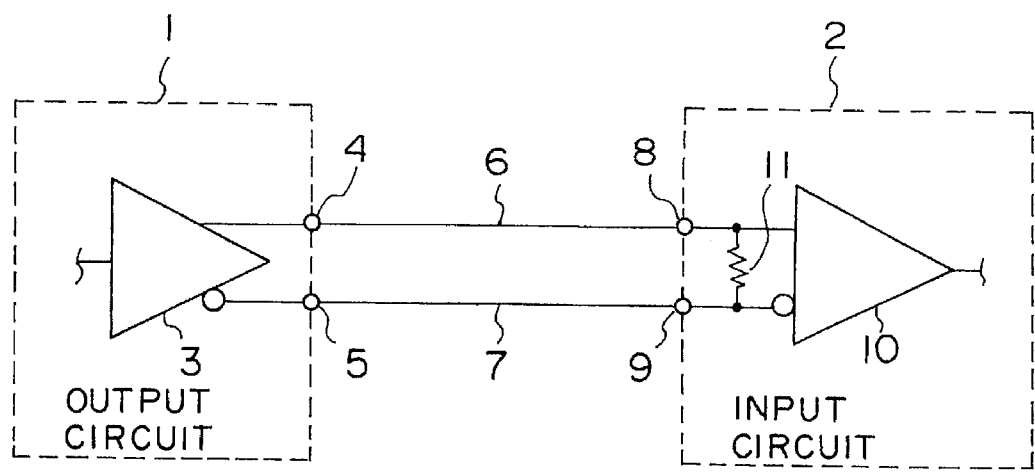
FIG. 5 is a circuit diagram of a low-voltage-differential-signal (LVDS) transmission system to which the present invention is applied.
Figure 6:
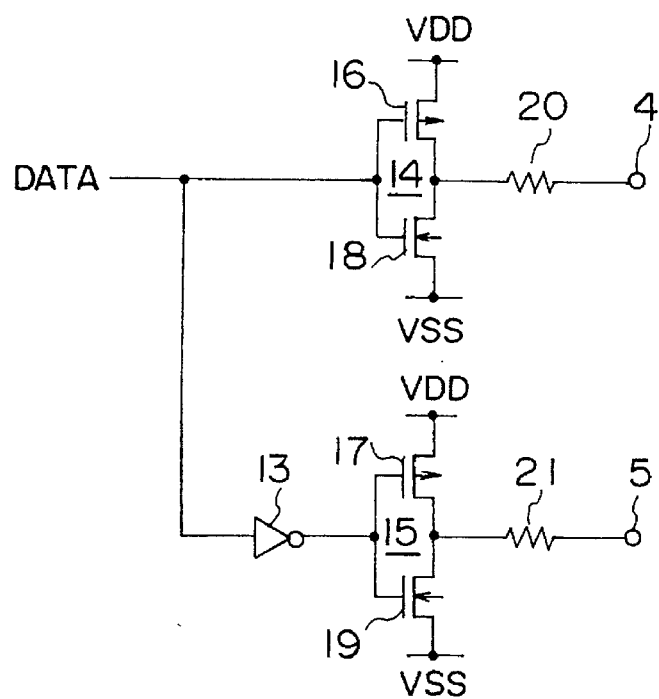
FIG. 6 is a circuit diagram of a conceived output circuit which is included in the low-voltage-differential-signal (LVDS) transmission system in FIG. 5.

FIG. 4 shows an output circuit of a semiconductor device in a further embodiment of the present invention. The output circuit in FIG. 4 is included in the semiconductor device shown in this embodiment.

Referring to FIG. 4, reference numeral 87 indicates a semiconductor chip, and reference numerals 88 and 89 indicate signal generator units, each of which is the same as the signal generator unit 45 in FIG. 3. The semiconductor device in this embodiment is fabricated on the semiconductor chip 87.

The output circuit in FIG. 4 includes data lines from which level signals DATA4 and DATA5 from internal circuits (not shown) are inputted. The level signals DATA4 and DATA5 are indicative of CMOS level data. The level signal DATA4 is inputted to the signal generator unit 88, and the level signal DATA5 is inputted to the signal generator unit 89.

The output circuit in FIG. 4 includes an output terminal 90 to which an output signal OUT4 from the signal generator unit SS is outputted, and an output terminal 91 to which an inverted output signal OUT4 from the signal generator 88 is outputted. The output signal OUT4 and the output signal, /OUT4 have a complementary relation.

The output circuit in FIG. 4 includes an output terminal 92 to which an output signal OUT5 from the signal generator unit 89 is outputted, and an output terminal 93 to which an inverted output signal /OUT5 from the signal generator unit 89 is outputted. The output signal OUT5 and the output signal /OUT5 have a complementary relation.

The output circuit in FIG. 4 includes an output level setting unit 94 which is the same as the output level setting unit 48 in FIG. 3. Similarly to the previous embodiment of FIG. 3, the output level setting unit 94 determines level values of the output signals OUT4 and /OUT4 from the signal generator unit 88 and determines level values of the output signals OUT5 and /OUT5 from the signal generator unit 89.

The output level setting unit 94 has an output terminal 95 to which the source-power voltage VT3 is outputted, an output terminal 96 to which the source-power voltage VT4 is outputted, and an input terminal 97 from which the intermediate voltage of VDD/2 is inputted. The output terminal 95 in this embodiment is the same as the output terminal 67 in FIG. 3. The output terminal 96 in this embodiment is the same as the output terminal 75 in FIG. 3. The input terminal 97 in this embodiment is the same as the input terminal 85 in FIG. 3.

In the above embodiment, shown in FIG. 4, the source-power voltage VT3 is used as the high-level value, and the source-power voltage VT4 is used as the low-level value. It is possible that the output circuit in this embodiment transmit the output signals OUT4 and /OUT4 and the output signals OUT5 and /OUT5 with accurate high-level and low-level values. The amplitude of the output signals OUT4, /OUT4, OUT5, and /OUT5 can be made smaller than the amplitude of the level signals DATA4 and DATA5 indicative of the CMOS level data. Therefore, the output circuit of the semiconductor device in the above embodiment can provide high-speed signal transmission.

In the above embodiment, the output circuit does not require resistors with precise resistances included therein, such resistors causing the cost to be increased. Therefore, it can provide the semiconductor device having the output circuit with a low cost.

The above embodiment is appropriate for applications to the output circuit of the LVDS transmission system. A modification of the output circuit in this embodiment may be made, so that it includes input terminals from which the source-power voltages VT3 and VT4 are inputted. In this modification, it is possible to input the source-power voltages VT3 and VT4 the levels of which are variable according to the operating conditions of the output circuit. This is useful when desired high-level and low-level values of the source-power voltages VT3 and VT4 are inputted.

What is claimed is:

1. A semiconductor device having an output circuit which comprises:

a first field-effect transistor having a source connected to a line from which a first voltage is inputted;

a second field-effect transistor having a source connected to a drain of said first field-effect transistor, a gate connected to a data line from which a level signal is inputted, and a drain connected to an output terminal to which an output signal is outputted; and a control unit which controls a voltage at a gate of said first field-effect transistor when the second field-effect transistor is in ON state, so that a voltage at the drain of said second field-effect transistor is held at a second voltage, wherein said output circuit further comprises an input terminal from which the second voltage is inputted to said control unit.

2. The semiconductor device according to claim 1, wherein said first field-effect transistor is an n-channel field-effect transistor, said second field-effect transistor is an n-channel field-effect transistor, and said second voltage is higher than the first voltage.

3. The semiconductor device according to claim 2, wherein said output circuit further comprises a resistor which has one end connected to the drain of said second field-effect transistor, and the other end of said resistor is connected to a line from which a third voltage that is higher than said second voltage is inputted.

4. The semiconductor device according to claim 1, wherein said first field-effect transistor is a p-channel field-effect transistor, said second field-effect transistor is a p-channel field-effect transistor, and said second voltage is lower than the first voltage.

5. The semiconductor device according to claim 4, wherein said output circuit further comprises a resistor which has one end connected to the drain of said second field-effect transistor, and the other end of said resistor is connected to a line from which a third voltage that is lower than said second voltage is inputted.

6. A semiconductor device having an output circuit which comprises:

a first field-effect transistor having a source connected to a line from which a first voltage is inputted;

a second field-effect transistor having a source connected to a drain of said first field-effect transistor, a gate connected to a data line from which a level signal is inputted, and a drain connected to an output terminal to which an output signal is outputted; and a control unit which controls a voltage at a gate of said first field-effect transistor when the second transistor is in ON state, so that a voltage at the drain of said second field-effect transistor is held at a second voltage wherein said control unit comprises a differential amplifier which has a noninverting input, an inverting input, and an output, said noninverting input being connected to the drain of the second field-effect transistor, the second voltage being inputted to said inverting input, and said output of said differential amplifier being connected to the gate of the first field-effect transistor.

7. A semiconductor device having an output circuit which comprises:

a first p-channel field-effect transistor having a source connected to a first line from which a first voltage is inputted;

a second p-channel field-effect transistor having a source connected to a drain of said first p-channel field-effect transistor, said second p-channel field-effect transistor being in ON state when said output circuit is operated;

a first control unit which controls a voltage at a gate of said first p-channel field-effect transistor when said second p-channel field-effect transistor is in ON state, so that a voltage at a drain of said second p-channel field-effect transistor is held at a second voltage lower than said first voltage;

a first n-channel field-effect transistor having a source connected to a second line from which a third voltage lower than said second voltage is inputted;

a second n-channel field-effect transistor having a source connected to a drain of said first n-channel field-effect transistor, said second n-channel field-effect transistor being in ON state when said output circuit is operated;

a second control unit which controls a voltage at a gate of said first n-channel field-effect transistor when said second n-channel field-effect transistor is in ON state, so that a voltage at a drain of said second n-channel field-effect transistor is held at a fourth voltage higher than said third voltage, said fourth voltage being lower than said second voltage; and a signal generator unit which generates output signals, voltages of said output signals being controlled by said first control unit and said second control unit, so that high-level values of said output signals are equal to the voltage at the drain of said second p-channel field-effect transistor and low-level values of said output signals are equal to the voltage at the drain of said second n-channel field-effect transistor.

8. The semiconductor device according to claim 7, wherein said first control unit comprises a first differential amplifier which includes a noninverting input, an inverting input and an output, said noninverting input being connected to the drain of the second p-channel field-effect transistor, said second voltage being inputted to said inverting input, and said output of said first differential amplifier being connected to the gate of the first p-channel field-effect transistor, and wherein said second control unit comprises a second differential amplifier which includes a noninverting input, an inverting input and an output, said noninverting input being connected to the drain of the second n-channel field-effect transistor, said fourth voltage being applied to said inverting input, and said output of said second differential amplifier being connected to the gate of the first n-channel field-effect transistor.

9. The semiconductor device according to claim 8, wherein said signal generator unit comprises a first inverter which includes:

a third p-channel field-effect transistor having a source connected to a third line from which said first voltage is inputted, and a gate connected to the output of said first differential amplifier;

a fourth p-channel field-effect transistor having a source connected to a drain of the third p-channel field-effect transistor, and a drain connected to a first output terminal, ON/OFF state of said fourth p-channel field-effect transistor being controlled according to a first signal;

a third n-channel field-effect transistor having a drain connected to said first output terminal, ON/OFF state of said third n-channel field effect transistor being controlled according to said first signal; and a fourth n-channel field-effect transistor having a source connected to a fourth line from which said third voltage is inputted, a drain connected to the source of the third n-channel field-effect transistor, and a gate connected to the output of the second differential amplifier.

10. The semiconductor device according to claim 9, wherein said signal generator unit further comprises a second inverter which includes:

a fifth p-channel field-effect transistor having a source connected to a fifth line from which said first voltage is inputted, and a gate connected to the output of the first differential amplifier;

a sixth p-channel field-effect transistor having a source connected to a drain of said fifth p-channel field-effect transistor, and a drain connected to a second output terminal, ON/OFF state of said sixth p-channel field-effect transistor being controlled according to a second signal, said second signal having a complementary relation to said first signal;

a fifth n-channel field-effect transistor having a drain connected to said second output terminal, ON/OFF state of said fifth n-channel field-effect transistor being controlled according to said second signal; and a sixth n-channel field-effect transistor having a drain connected to a source of said fifth n-channel field-effect transistor, a source connected to a sixth line from which said third voltage is inputted, and a gate connected to the output of the second differential amplifier, wherein said second inverter outputs an output signal which has a complementary relation to an output signal output by said first inverter.

11. The semiconductor device according to claim 8, wherein said output circuit further comprises a resistor unit which interconnects the drain of the second p-channel field-effect transistor and the drain of the second n-channel field-effect transistor.

12. The semiconductor device according to claim 11, wherein said resistor unit comprises a first resistor and a second resistor which are connected in series, an intermediate voltage between said second voltage and said fourth voltage being inputted to a connection point between said first resistor and said second resistor.

* * * * *